US012787520B2

(12) United States Patent
Lee et al.

(10) Patent No.: US 12,787,520 B2
(45) Date of Patent: Nov. 3, 2026

(54) DISPLAY DEVICE

(71) Applicant: Samsung Display Co., Ltd., Yongin-si (KR)

(72) Inventors: Seung-Hee Lee, Hwaseong-si (KR); Dongwan Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 825 days.

(21) Appl. No.: 18/110,614

(22) Filed: Feb. 16, 2023

(65) Prior Publication Data

US 2023/0282793 A1 Sep. 7, 2023

(30) Foreign Application Priority Data

Mar. 2, 2022 (KR) ........................ 10-2022-0026784

(51) Int. Cl.
*H10H 20/857* (2025.01)
*G09G 3/32* (2016.01)
*H05K 1/189* (2026.01)

(52) U.S. Cl.
CPC ............ *H10H 20/857* (2025.01); *G09G 3/32* (2013.01); *H05K 1/189* (2013.01); *H05K 2201/10128* (2013.01)

(58) Field of Classification Search
CPC ...... H10H 20/857; G09G 3/32; G09G 3/2092; G09G 2300/023; G09G 2300/0426; G09F 9/335; G09F 9/301; H05K 1/189; H05K 2201/10128; H10K 71/50; H10K 50/80; H10K 59/131; H10K 77/10
See application file for complete search history.

(56) References Cited

U.S. PATENT DOCUMENTS

| | | | | |
|---|---|---|---|---|
| 10,754,463 | B2 | 8/2020 | Kim | |
| 10,910,592 | B2 | 2/2021 | Kuon et al. | |
| 11,320,704 | B2 | 5/2022 | Lee et al. | |
| 11,841,745 | B2 | 12/2023 | Baek et al. | |
| 2013/0270580 | A1* | 10/2013 | Choi .................... | H10H 20/857 257/82 |

(Continued)

FOREIGN PATENT DOCUMENTS

| | | | |
|---|---|---|---|
| JP | 2013029631 A * | 2/2013 | |
| KR | 100601334 B1 | 7/2006 | |

(Continued)

*Primary Examiner* — Brent D Castiaux
(74) *Attorney, Agent, or Firm* — CANTOR COLBURN LLP

(57) ABSTRACT

A display device includes a lower substrate including an active area and a peripheral area, a driving circuit electrically connected to a pixel, an upper substrate provided with a notch recessed in a first direction, and a flexible circuit board. The driving circuit and the flexible circuit board overlap the notch. The upper substrate includes an upper edge including a notch area and a straight area extending from the notch area. The notch area includes a first area, a second area facing the first area in a second direction crossing the first direction, and a third area disposed between the first area and the second area and extending in the second direction. An end portion of each of the first and second areas adjacent to the third area has a predetermined curvature, and an opposite end portion of each of the first and second areas has a predetermined curvature.

18 Claims, 11 Drawing Sheets

(56) References Cited

U.S. PATENT DOCUMENTS

| | | | | |
|---|---|---|---|---|
| 2017/0110685 | A1* | 4/2017 | Lee | H10K 59/1213 |
| 2019/0079625 | A1* | 3/2019 | Wang | G09G 3/20 |
| 2020/0168141 | A1* | 5/2020 | Ma | G09G 3/035 |
| 2021/0341662 | A1* | 11/2021 | Zhang | G02F 1/13458 |

FOREIGN PATENT DOCUMENTS

| | | | |
|---|---|---|---|
| KR | 102020824 | B1 | 10/2019 |
| KR | 1020190112242 | A | 10/2019 |
| KR | 1020200099632 | A | 8/2020 |
| KR | 1020210010763 | A | 1/2021 |

* cited by examiner

DISPLAY DEVICE

This application claims priority to Korean Patent Application No. 10-2022-0026784, filed on Mar. 2, 2022, and all the benefits accruing therefrom under 35 U.S.C. § 119, the content of which in its entirety is herein incorporated by reference.

BACKGROUND

1. Field

The disclosure relates to a display device. More particularly, the disclosure relates to a display device with improved reliability.

2. Description of the Related Art

Electronic devices that provide an image to a user, such as a smartphone, a digital camera, a notebook computer, a navigation unit, and a smart television, include a display device to display the image. The display device generates the image and provides the image to the user through a display screen.

The display device includes pixels and a driving circuit to drive the pixels. The pixels are disposed in a display area of the display device, and the driving circuit is disposed in a peripheral area surrounding the display area.

SUMMARY

The disclosure provides a display device with improved reliability.

An embodiment of the disclosure provides a display device including a lower substrate including an active area in which a pixel including a light-emitting element is disposed and a peripheral area adjacent to the active area, a driving circuit electrically connected to the pixel and disposed in the peripheral area, an upper substrate overlapping the active area and the peripheral area and provided with a notch defined therein and recessed in a first direction toward the active area, and a flexible circuit board disposed in the peripheral area. A portion of the peripheral area that does not overlap the notch is covered by the upper substrate, and the driving circuit and the flexible circuit board overlap the notch. The upper substrate includes an upper edge including a notch area defining the notch and a straight area extending from the notch area, and the notch area includes a first area, a second area facing the first area in a second direction crossing the first direction, and a third area disposed between the first area and the second area and extending in the second direction. Each of a first end portion of the first area adjacent to the third area and a first end portion of the second area adjacent to the third area has a predetermined curvature, and each of a second end portion of the first area and a second end portion of the second area has a predetermined curvature.

In an embodiment, each of a curvature center of the first end portion of the first area and a curvature center of the first end portion of the second area is disposed outside the upper substrate, and each of a curvature center of the second end portion of the first area and a curvature center of the second end portion of the second area is disposed inside the upper substrate.

In an embodiment, a curvature of the first end portion of the first area is equal to a curvature of the second end portion of the first area, and a curvature of the first end portion of the second area is equal to a curvature of the second end portion of the second area.

In an embodiment, the first area further includes a first extension portion that is disposed between the first end portion of the first area and the second end portion of the first area and extends in a straight line, and the second area further includes a second extension portion that is disposed between the first end portion of the second area and the second end portion of the second area and extends in a straight line.

In an embodiment, a separation distance in the first direction between a vertex of the flexible circuit board overlapping the lower substrate and the notch area is equal to a separation distance in the second direction between the vertex and the notch area in a plan view.

In an embodiment, the lower substrate includes a lower edge corresponding to the upper edge and extending in the second direction, and the straight area is aligned with the lower edge.

In an embodiment, the display device further includes a coupling member coupling the lower substrate and the upper substrate, and portions of the coupling member, which are adjacent to the notch area and the straight area, extend in the second direction.

In an embodiment, the driving circuit is disposed between the third area and the flexible circuit board in a plan view, and a length, in the second direction, of the third area is equal to or greater than a length, in the second direction, of the driving circuit.

In an embodiment, the display device further includes a main circuit board attached to the flexible circuit board, the flexible circuit board is bent with respect to an imaginary axis extending in the second direction, and the main circuit board is disposed under the lower substrate.

In an embodiment, the straight area includes at least one of a first straight area extending from the second end portion of the first area with respect to the second direction and a second straight area extending from the second end portion of the second area with respect to the second direction.

In an embodiment, the display device further includes a main circuit board. Each of the notch, the driving circuit, and the flexible circuit board is provided in plural, the notches are arranged in the second direction, each of the driving circuits overlaps a corresponding notch among the notches, each of the flexible circuit boards overlaps a corresponding notch among the notches, and the main circuit board is attached to the flexible circuit boards.

In an embodiment, the notch area is provided in plural, and the notch areas define the notches, respectively, and the straight area includes one or more sub-areas each being disposed between the notch areas adjacent to each other.

In an embodiment, the straight area further includes at least one of a first straight area extending from the notch area disposed at a leftmost position among the notch areas to be spaced away from the sub-areas with respect to the second direction and a second straight area extending from the notch area disposed at a rightmost position among the notch areas to be spaced away from the sub-areas with respect to the second direction.

In an embodiment, the lower substrate has a thickness smaller than a thickness of the upper substrate.

An embodiment of the disclosure provides a display device including a lower substrate including an active area in which a pixel including a light-emitting element is disposed and a peripheral area adjacent to the active area, a driving circuit electrically connected to the pixel and disposed in the peripheral area, an upper substrate overlapping the active area and the peripheral area and provided with a notch defined therein and recessed in a first direction toward the active area, a coupling member coupling the lower substrate with the upper substrate, and a flexible circuit board disposed in the peripheral area. A portion of the peripheral area that does not overlap the notch is covered by the upper substrate, and the driving circuit and the flexible circuit board overlap the notch. The lower substrate includes a lower edge extending in a second direction crossing the first direction, the upper substrate includes an upper edge including a notch area defining the notch and a straight area extending from the notch area and corresponding to the lower edge, and a portion of the coupling member, which is adjacent to the notch area, extends in the second direction.

In an embodiment, the coupling member includes a first coupling edge adjacent to the active area and a second coupling edge facing the first coupling edge in the first direction and adjacent to the upper edge, and each of the first and second coupling edges extends in a straight line.

In an embodiment, the notch area includes a first area, a second area facing the first area in the second direction, and a third area disposed between the first area and the second area and extending in the second direction, each of a first end portion of the first area adjacent to the third area and a first end portion of the second area adjacent to the third area has a predetermined curvature, and each of a second end portion of the first area and a second end portion of the second area has a predetermined curvature.

In an embodiment, the straight area includes at least one of a first straight area extending from the second end portion of the first area with respect to the second direction and a second straight area extending from the second end portion of the second area with respect to the second direction and is aligned with the lower edge.

In an embodiment, each of a curvature center of the first end portion of the first area and a curvature center of the first end portion of the second area is disposed outside the upper substrate, and each of a curvature center of the second end portion of the first area and a curvature center of the second end portion of the second area is disposed inside the upper substrate.

In an embodiment, a separation distance in the first direction between a vertex of the flexible circuit board overlapping the lower substrate and the notch area is equal to a separation distance in the second direction between the vertex and the notch area in a plan view.

According to the above, a rigidity of an end portion of the display panel to which the flexible circuit board is attached is improved. Accordingly, the display panel is prevented from being damaged due to external impacts, and a defective rate of the display device is reduced. As an result, the reliability of the display device is improved.

BRIEF DESCRIPTION OF THE DRAWINGS

The above and other advantages of the disclosure will become readily apparent by reference to the following detailed description when considered in conjunction with the accompanying drawings, in which.

DETAILED DESCRIPTION

Figure 1:
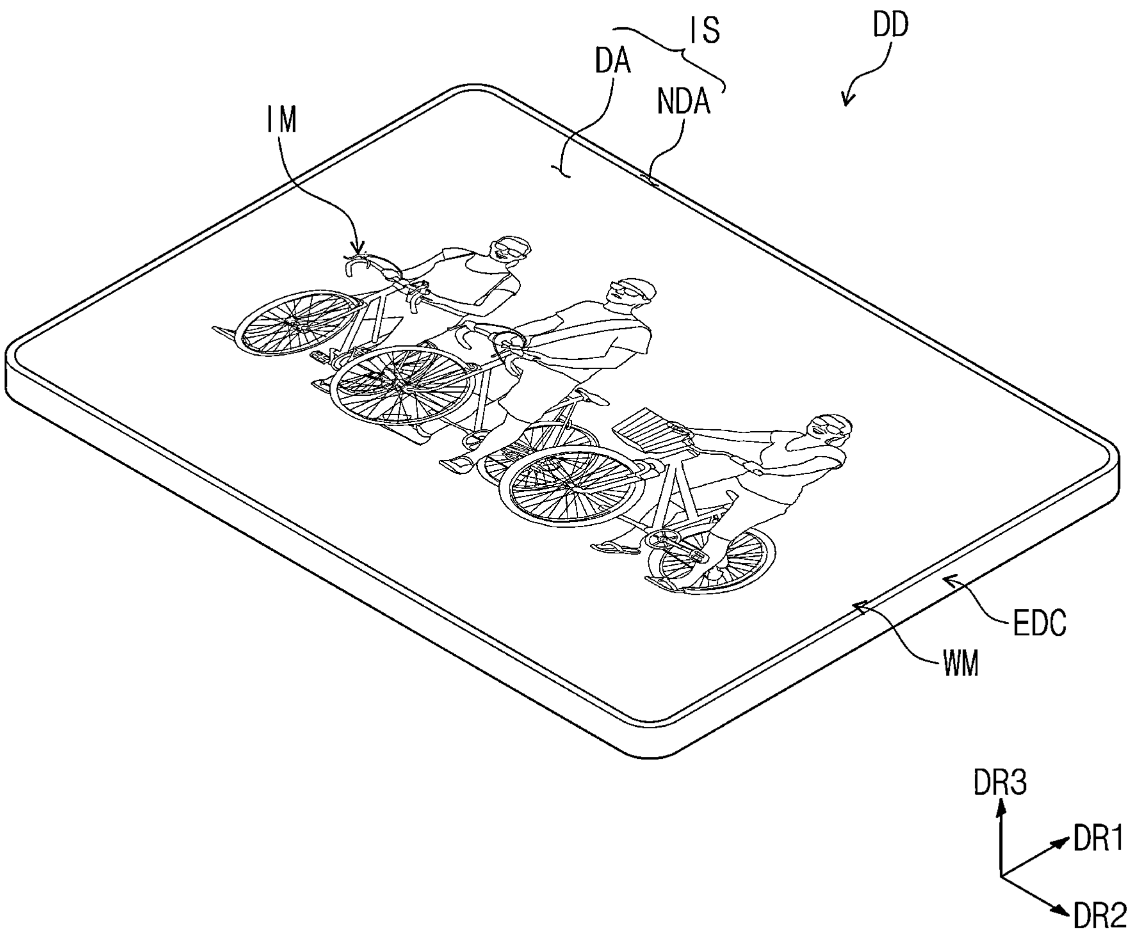
FIG. 1 is a perspective view of an embodiment of a display device according to the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" may include any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" or the like, may be used herein for ease of description to describe one element or feature's relationship to another elements or features as shown in the drawing figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

Figure 2A:
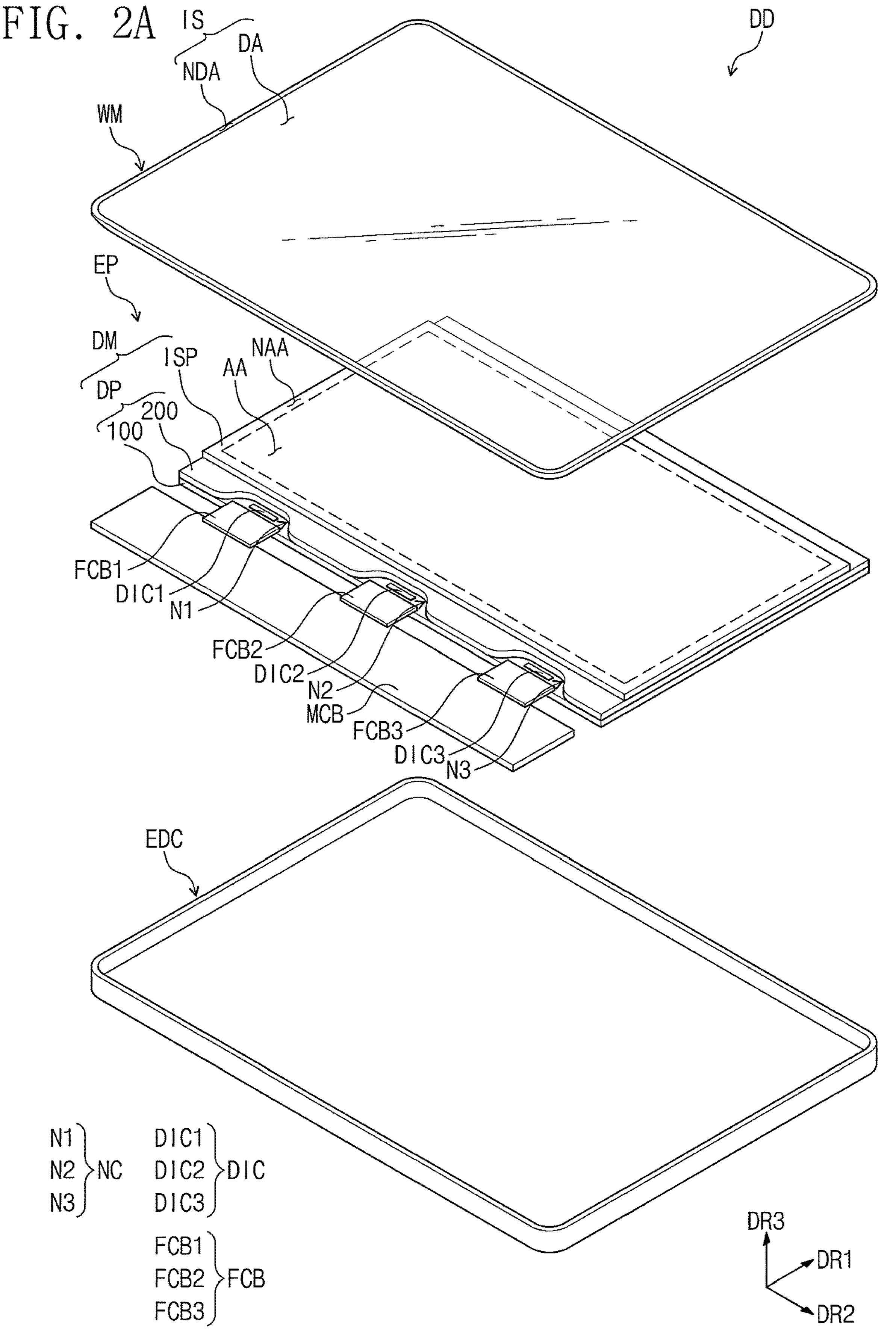
FIG. 2A is an exploded perspective view of an embodiment of a display device according to the disclosure.
Figure 2B:
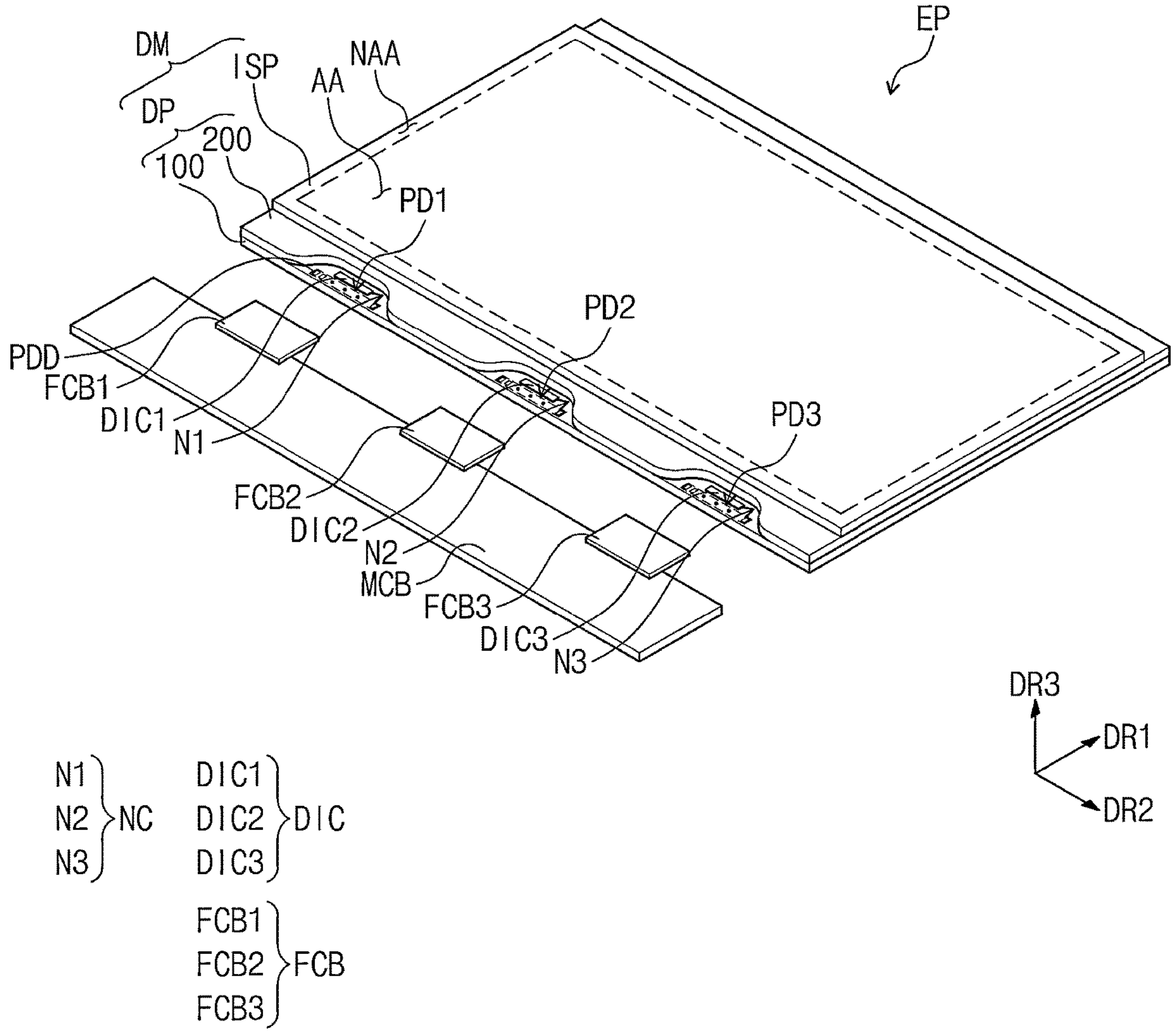
FIG. 2B is an exploded perspective view of an embodiment of an electronic panel according to the disclosure.
Figure 3:
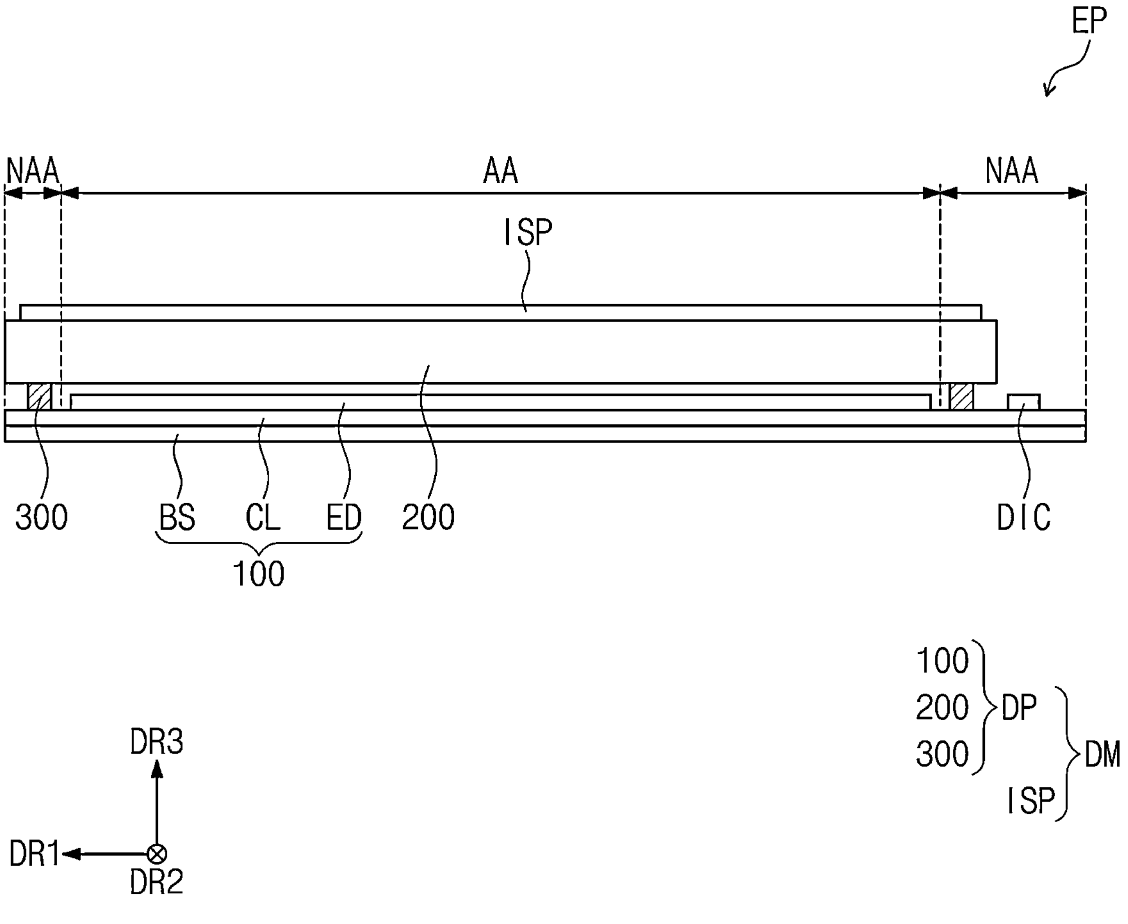
FIG. 3 is a cross-sectional view of an embodiment of some components of an electronic panel according to the disclosure.

FIG. 1 is a perspective view of an embodiment of a display device DD according to the disclosure. FIG. 2A is an exploded perspective view of an embodiment of the display device DD according to the disclosure. FIG. 2B is an exploded perspective view of an embodiment of an electronic panel EP according to the disclosure. FIG. 3 is a cross sectional view of an embodiment of some components of the electronic panel EP according to the disclosure.

Referring to FIG. 1, the display device DD may be a device activated in response to an electrical signal. The display device DD may be applied to a large-sized display device, such as a television set or a monitor, and a small and medium-sized display device, such as a mobile phone, a tablet computer, a notebook computer, a car navigation unit, or a game unit. However, these are merely some of embodiments, and the display device DD may be applied to other electronic devices as long as they do not depart from the concept of the disclosure. Hereinafter, the tablet computer will be described as the display device DD in FIGS. 1 to 7.

The display device DD may have a quadrangular (e.g., rectangular) shape defined by short sides extending in a first direction DR1 and long sides extending in a second direction DR2 crossing the first direction DR1. However, the shape of the display device DD should not be limited to the quadrangular (e.g., rectangular) shape, and the display device DD may have a variety of shapes. The display device DD may display an image IM toward a third direction DR3 through a display surface IS that is substantially parallel to each of the first direction DR1 and the second direction DR2. The display surface IS through which the image IM is displayed may correspond to a front surface of the display device DD.

In the illustrated embodiment, front (or upper) and rear (or lower) surfaces of each member are defined with respect to the direction in which the image IM is displayed. The front and rear surfaces are opposite to each other in the third direction DR3, and a normal line direction of each of the front and rear surfaces may be substantially parallel to the third direction DR3.

A separation distance in the third direction DR3 between the front surface and the rear surface may correspond to a thickness in the third direction DR3 of the display device DD. Directions indicated by the first, second, and third directions DR1, DR2, and DR3 may be relative to each other and may be changed to other directions.

The display device DD may sense an external input applied thereto from the outside. The external input may include an input generated by a user. The external input by the user may include one of various forms of external inputs, such as a portion of a body of the user, light, heat, gaze, or pressure, or any combinations thereof. In an embodiment, the external input may include inputs generated by an input device, e.g., a stylus pen, an active pen, a touch pen, an electronic pen, an e-pen, or the like.

The display surface IS of the display device DD may include a display area DA and a non-display area NDA. The display area DA may be an area through which the image IM is displayed. The user may view the image IM through the display area DA. In the illustrated embodiment, the display area DA may have a quadrangular shape with rounded vertices, however, this is merely one of embodiments. The display area DA may have a variety of shapes and should not be particularly limited.

The non-display area NDA may be defined adjacent to the display area DA. The non-display area NDA may surround the display area DA. Accordingly, the display area DA may have a shape defined by the non-display area NDA, however, this is merely one of embodiments. In an embodiment, the non-display area NDA may be disposed adjacent to only one side of the display area DA or may be omitted. The display device DD may include various embodiments and should not be particularly limited.

Referring to FIGS. 2A, 2B, and 3, the display device DD may include an electronic panel EP, a window WM, and an external case EDC. The electronic panel EP may include a display module DM, driving circuits DIC, flexible circuit boards FCB, and a main circuit board MCB.

The display module DM may include a display panel DP and an input sensing panel ISP. The display module DM may display the image IM (refer to FIG. 1) and may sense the external input.

In an embodiment, the display panel DP may be a light-emitting type display panel. In an embodiment, the display panel DP may be an organic light-emitting display panel, an inorganic light-emitting display panel, or a quantum dot light-emitting display panel. A light-emitting layer of the organic light-emitting display panel may include an organic light-emitting material. A light-emitting layer of the inorganic light-emitting display panel may include an inorganic light-emitting material. A light-emitting layer of the quantum dot light-emitting display panel may include a quantum dot or a quantum rod. Hereinafter, the organic light-emitting display panel will be described as the display panel DP. The display panel DP may output the image IM (refer to FIG. 1), and the output image IM (refer to FIG. 1) may be displayed through the display surface IS.

In the illustrated embodiment, the display panel DP may include a lower substrate 100, an upper substrate 200, and a coupling member 300.

The lower substrate 100 may include an active area AA and a peripheral area NAA. The active area AA may be an area activated in response to an electrical signal. In the illustrated embodiment, the active area AA may be an area through which the image IM (refer to FIG. 1) is displayed. The lower substrate 100 may include pixels PX (refer to FIG. 4) that substantially generate the image IM, and the pixels PX (refer to FIG. 4) may be arranged in the active area AA. The peripheral area NAA may be disposed adjacent to the active area AA. The peripheral area NAA may surround the active area AA.

The active area AA may correspond to the display area DA, and the peripheral area NAA may correspond to the non-display area NDA. In the disclosure, the expression "an area/portion corresponds to another area/portion" means that "an area/portion overlaps another area/portion", and the "areas and portions" should not be limited to having the same size as each other.

The lower substrate 100 may include a base substrate BS, a display circuit layer CL, and a display element layer ED. In an embodiment, the lower substrate 100 may further include a separate insulating layer that covers the display element layer ED.

The base substrate BS may include a glass substrate, a metal substrate, or an organic/inorganic composite material substrate.

The display circuit layer CL may be disposed on the base substrate BS. The display circuit layer CL may include at least one insulating layer and a circuit element. The insulating layer may include at least one inorganic layer and at least one organic layer. The circuit element may include a signal line and a driving circuit of the pixel. The display circuit layer CL may be formed by forming an insulating layer, a semiconductor layer, and a conductive layer using a coating or depositing process and patterning the insulating layer, the semiconductor layer, and the conductive layer using a photolithography process.

The display element layer ED may be disposed on the display circuit layer CL. The display element layer ED may be disposed in the active area AA. The display element layer ED may include a light-emitting element and a pixel definition layer. In an embodiment, the light-emitting element may include a lower electrode connected to the circuit element, a light-emitting layer disposed on the lower electrode, and an upper electrode disposed on the light-emitting layer. The pixel definition layer may be provided with a pixel opening defined therethrough to expose a portion of the lower electrode, and the pixel opening may define a light-emitting area.

The upper substrate 200 may overlap the active area AA and the peripheral area NAA of the lower substrate 100. The upper substrate 200 may cover the pixels PX (refer to FIG. 4). The upper substrate 200 may encapsulate the pixels PX (refer to FIG. 4) to prevent the pixels PX (refer to FIG. 4) from being damaged due to an external moisture. The upper substrate 200 may include a glass substrate.

Notches NC may be defined in the upper substrate 200. Each of the notches NC may be defined by recessing the upper substrate 200 from an external side surface of the upper substrate 200 extending in the second direction DR2 to the first direction DR1 toward the active area AA. The notches NC may include a first notch N1, a second notch N2, and a third notch N3. The first, second, and third notches N1, N2, and N3 may be arranged in the second direction DR2.

As shown in FIG. 2B, the lower substrate 100 may include pad portions PD1, PD2, and PD3 arranged adjacent to an edge of the lower substrate 100 in the peripheral area NAA. The pad portions PD1, PD2, and PD3 may include a first pad portion PD1, a second pad portion PD2, and a third pad portion PD3.

The first pad portion PD1 may overlap the first notch N1, the second pad portion PD2 may overlap the second notch N2, and the third pad portion PD3 may overlap the third notch N3. Accordingly, the first, second, and third pad portions PD1, PD2, and PD3 may be exposed respectively through the first, second, and third notches N1, N2, and N3 without being covered by the upper substrate 200. Each of the first, second, and third pad portions PD1, PD2, and PD3 may include pads PDD. The pads PDD may be connected to data lines DL, a power line PL, and a control signal line CSL described later with reference to FIG. 4.

In an embodiment, the lower substrate 100 may have a thickness smaller than a thickness of the upper substrate 200. In a manufacturing process of the display panel DP, a chemical etching process may be applied to the base substrate BS (refer to FIG. 3) of the lower substrate 100 after the lower substrate 100 and the upper substrate 200 are coupled with each other, to reduce a thickness of the display panel DP.

The coupling member 300 may be disposed between the upper substrate 200 and the lower substrate 100 to couple the upper substrate 200 with the lower substrate 100. The coupling member 300 may overlap the peripheral area NAA. The coupling member 300 may encapsulate the pixels PX (refer to FIG. 4) to prevent the pixels PX (refer to FIG. 4) from being damaged due to the external moisture.

The coupling member 300 may include a frit. The frit may be a ceramic adhesive material and may have a property of being cured after being exposed to a laser beam. The frit may include about 15 wt % to about 40 wt % of $V_2O_5$, about 10 wt % to about 30 wt % of $TeO_2$, about 1 wt % to about 15 wt % of $P_2O_5$, about 1 wt % to about 20 wt % of ZnO, about 5 wt % to about 30 wt % of $ZrO_2$, about 5 wt % to about 20 wt % of $WO_3$, and about 1 wt % to about 15 wt % of BaO as a main component and may include at least one of $Fe_2O_3$, CuO, MnO, $Al_2O_3$, $Na_2O$, and $Nb_2O_5$ as an additive. The frit of such a composition may have a coefficient of thermal expansion of about $40\times10^{-7}$ per degrees Celsius (/° C.) to about $100\times10^{-7}$/° C. and a glass transition temperature within a range from about 250° C. to 400° C.

The input sensing panel ISP may be disposed on the display panel DP and may sense the external input. In an embodiment, the input sensing panel ISP may sense the external input in an area corresponding to the active area AA of the lower substrate 100. The input sensing panel ISP may be attached to the display panel DP by an adhesive film.

The input sensing panel ISP may include sensing electrodes each including sensing patterns and sensing lines. The sensing patterns and the sensing lines may have a single-layer or multi-layer structure.

However, in an embodiment, the input sensing panel ISP may be omitted. In an embodiment, the input sensing panel ISP may be disposed between the lower substrate 100 and the upper substrate 200. In this case, the input sensing panel ISP may be disposed directly on the display panel DP. That is, the input sensing panel ISP may be formed on the display panel DP through successive processes, and an inner adhesive film (not shown) may not be disposed between the input sensing panel ISP and the display panel DP. The upper substrate 200 may be disposed on the input sensing panel ISP, and the upper substrate 200 may protect the input sensing panel ISP.

The driving circuits DIC may be disposed in the peripheral area NAA of the lower substrate 100. The driving circuits DIC may be disposed in areas of the lower substrate 100, which are exposed through the first, second, and third notches N1, N2, and N3 without being covered by the upper substrate 200. That is, each of the driving circuits DIC may overlap a corresponding notch among the first, second, and third notches N1, N2, and N3.

The driving circuits DIC may include a first driving circuit DIC1, a second driving circuit DIC2, and a third driving circuit DIC3. The first driving circuit DIC1 may overlap the first notch N1, the second driving circuit DIC2 may overlap the second notch N2, and the third driving circuit DIC3 may overlap the third notch N3. The first, second, and third driving circuits DIC1, DIC2, and DIC3 may be arranged spaced apart from each other in the second direction DR2.

Each of the driving circuits DIC may be disposed (e.g., mounted) on the display panel DP. Each of the driving circuits DIC may be electrically connected to the display panel DP and may apply an electrical signal to the display panel DP to drive the display panel DP.

The flexible circuit boards FCB may be connected to the display panel DP. An edge of each of the flexible circuit boards FCB may be disposed in the peripheral area NAA of the lower substrate 100. The edge of each of the flexible circuit boards FCB may overlap a corresponding notch among the notches NC.

In an embodiment, the flexible circuit boards FCB may include a first flexible circuit board FCB1, a second flexible circuit board FCB2, and a third flexible circuit board FCB3. The first flexible circuit board FCB1 may overlap the first notch N1, the second flexible circuit board FCB2 may overlap the second notch N2, and the third flexible circuit board FCB3 may overlap the third notch N3. The first, second, and third flexible circuit boards FCB1, FCB2, and FCB3 may be arranged spaced apart from each other in the second direction DR2.

The first flexible circuit board FCB1 may be spaced apart from the first driving circuit DIC1 in the first direction DR1. The second flexible circuit board FCB2 may be spaced apart from the second driving circuit DIC2 in the first direction DR1. The third flexible circuit board FCB3 may be spaced apart from the third driving circuit DIC3 in the first direction DR1.

Each of the flexible circuit boards FCB may include pads corresponding to the pads PDD of the lower substrate 100 and may electrically connected to the pads PDD via an anisotropic conductive adhesive layer.

FIGS. 2A and 2B show three driving circuits DIC and three flexible circuit boards FCB as an illustrative embodiment, however, the number of each of the driving circuits DIC and the flexible circuit boards FCB should not be particularly limited.

The main circuit board MCB may be connected to the flexible circuit boards FCB. The main circuit board MCB connected to the flexible circuit boards FCB may be electrically connected to the lower substrate 100. The main circuit board MCB may include a driving controller to drive the driving circuits DIC and a voltage generator to generate voltages desired for an operation of the display panel DP.

In the illustrated embodiment, each of the flexible circuit boards FCB may be bent with respect to an imaginary axis extending in the second direction DR2 such that the main circuit board MCB is disposed under the lower substrate 100. When the flexible circuit boards FCB is bent, the main circuit board MCB may face a lower surface of the lower substrate 100.

In the illustrated embodiment, the electronic panel EP may further include a separate flexible circuit board (not shown) to electrically connect the input sensing panel ISP to the main circuit board MCB. An edge of the separate flexible circuit board may be disposed on the input sensing panel ISP, and another edge of the separate flexible circuit board may be disposed on the main circuit board MCB, however, they should not be limited thereto or thereby. The electronic panel EP may further include a separate main circuit board connected to the separate flexible circuit board. In an embodiment, the input sensing panel ISP may be electrically connected to the main circuit board MCB via the flexible circuit boards FCB connected to the display panel DP without including the separate flexible circuit board connected to the input sensing panel ISP.

The window WM may include a transparent material through which the image IM (refer to FIG. 1) transmits. In an embodiment, the window WM may include glass, sapphire, or plastic. The window WM is shown as a single layer, however, it should not be limited thereto or thereby. The window WM may include plural layers.

The window WM may include a light-blocking pattern to define the non-display area NDA. The light-blocking pattern may be a colored organic layer and may be formed by a coating method.

The window WM may be coupled with the electronic panel EP by an adhesive film. In an embodiment, the adhesive film may be an optically clear adhesive ("OCA") film, however, the adhesive film should not be limited thereto or thereby and may include an ordinary adhesive. In an embodiment, the adhesive film may include an optically clear resin ("OCR") or a pressure sensitive adhesive ("PSA").

An anti-reflective layer may be disposed between the window WM and the electronic panel EP. The anti-reflective layer may reduce a reflectance with respect to an external light incident thereto from above the window WM. The anti-reflective layer may include a retarder and a polarizer. The retarder may be a film type or liquid crystal coating type. The polarizer may also be a film type or liquid crystal coating type. The film type polarizer and the film type retarder may include a stretching type synthetic resin film, and the liquid crystal coating type polarizer and the liquid crystal coating type retarder may include liquid crystals aligned in a predetermined alignment. The retarder and the polarizer may be implemented as one polarizing film.

In an embodiment, the anti-reflective layer may include color filters. An arrangement of the color filters may be determined by taking into account colors of lights generated by the pixels PX (refer to FIG. 4) included in the display panel DP. The anti-reflective layer may further include a light-blocking pattern.

The external case EDC may accommodate the electronic panel EP. The external case EDC may be coupled with the window WM to define an exterior of the display device DD. The external case EDC may absorb impacts applied thereto from the outside and may prevent foreign substances/moisture from entering the electronic panel EP to protect components accommodated in the external case EDC. In an embodiment, the external case EDC may be obtained by assembling a plurality of accommodating members.

The display device DD may further include an electronic module including various functional modules to operate the electronic panel EP, a power supply module, e.g., a battery, supplying a power source desired for an overall operation of the display device DD, and a bracket coupled with the electronic panel EP and/or the external case EDC to divide an inner spaced of the display device DD.

Figure 4:
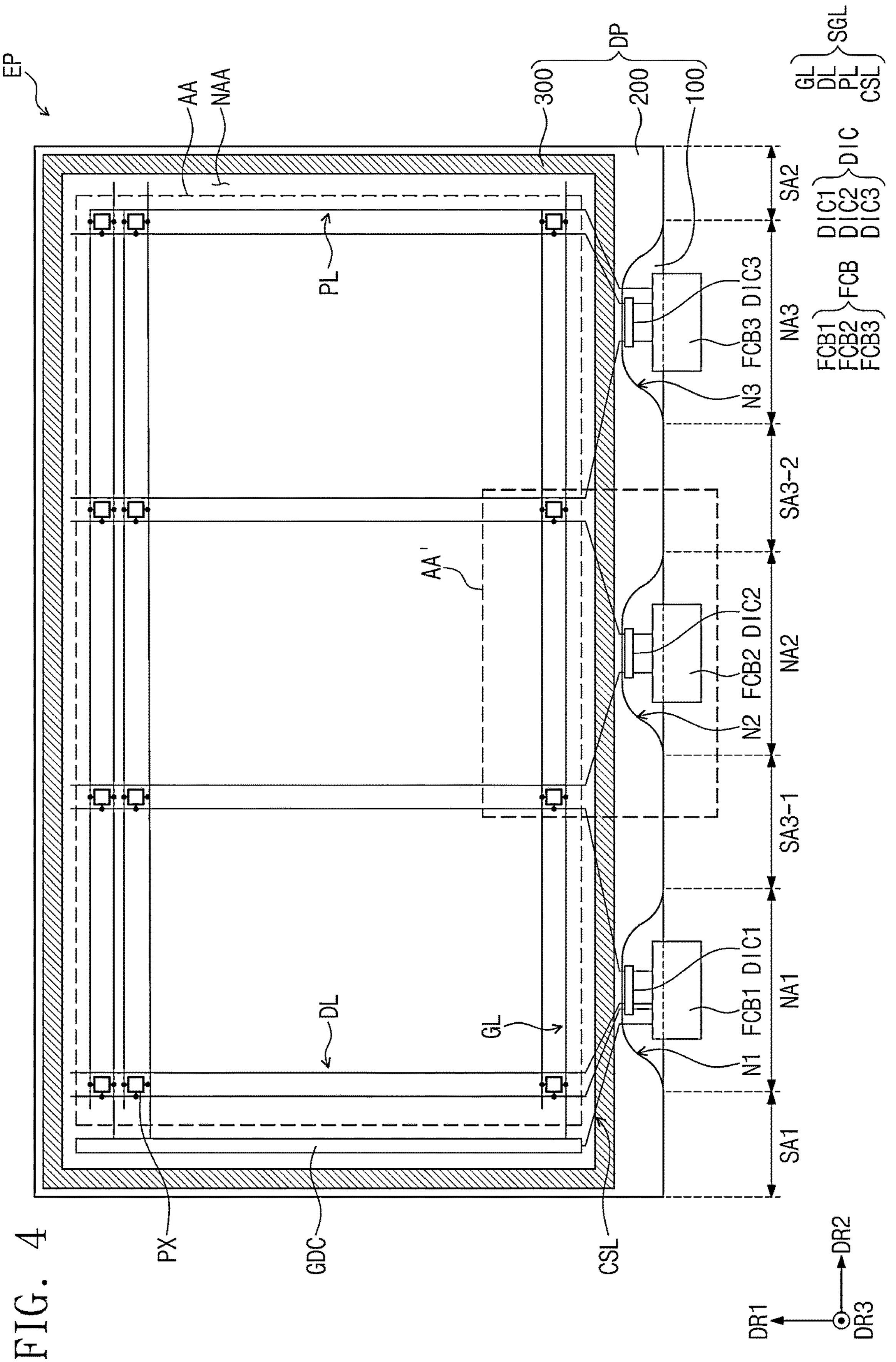
FIG. 4 is a plan view of an embodiment of some components of an electronic panel according to the disclosure.
Figure 5:
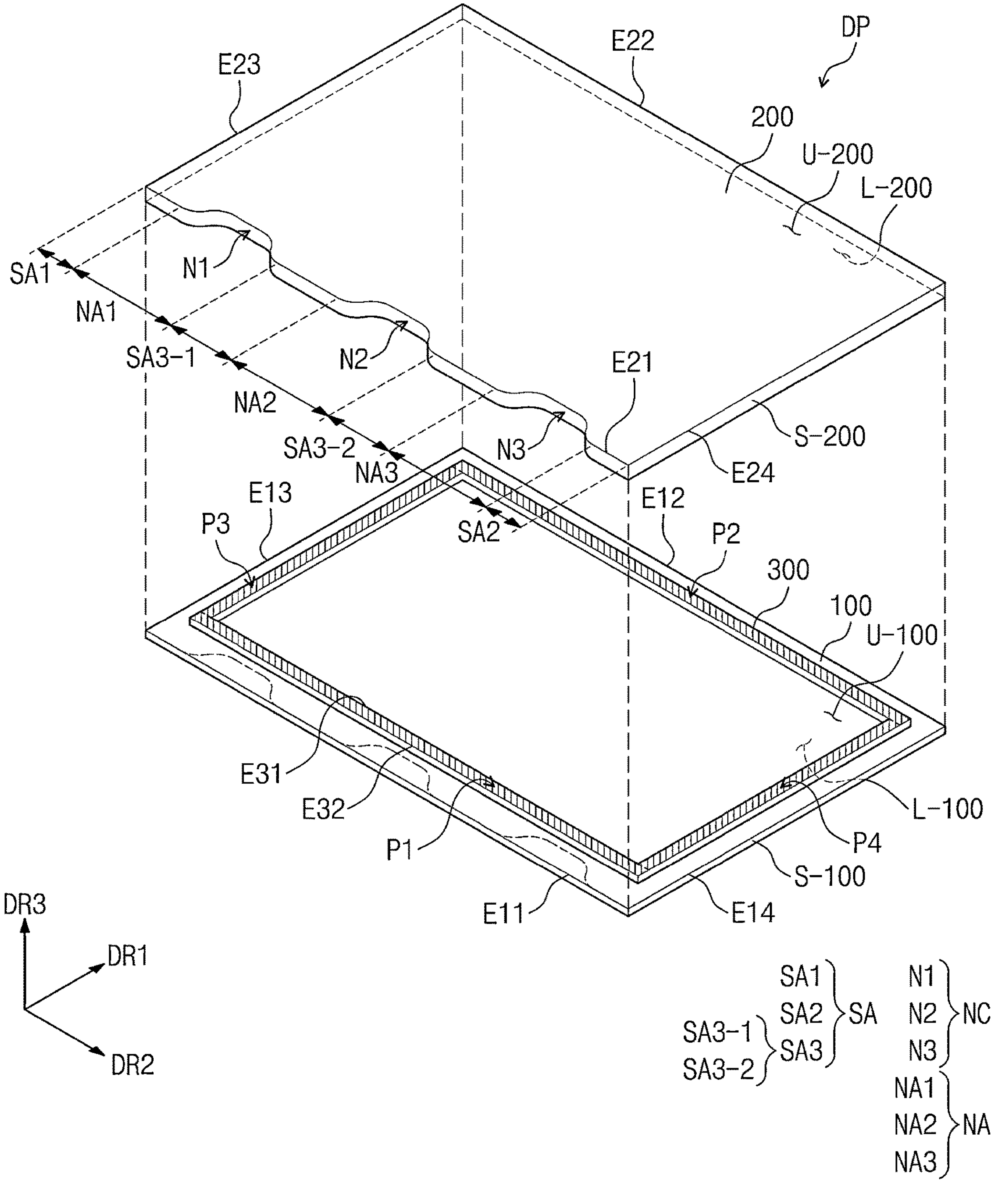
FIG. 5 is an exploded perspective view of an embodiment of a display panel according to the disclosure.
Figure 6:
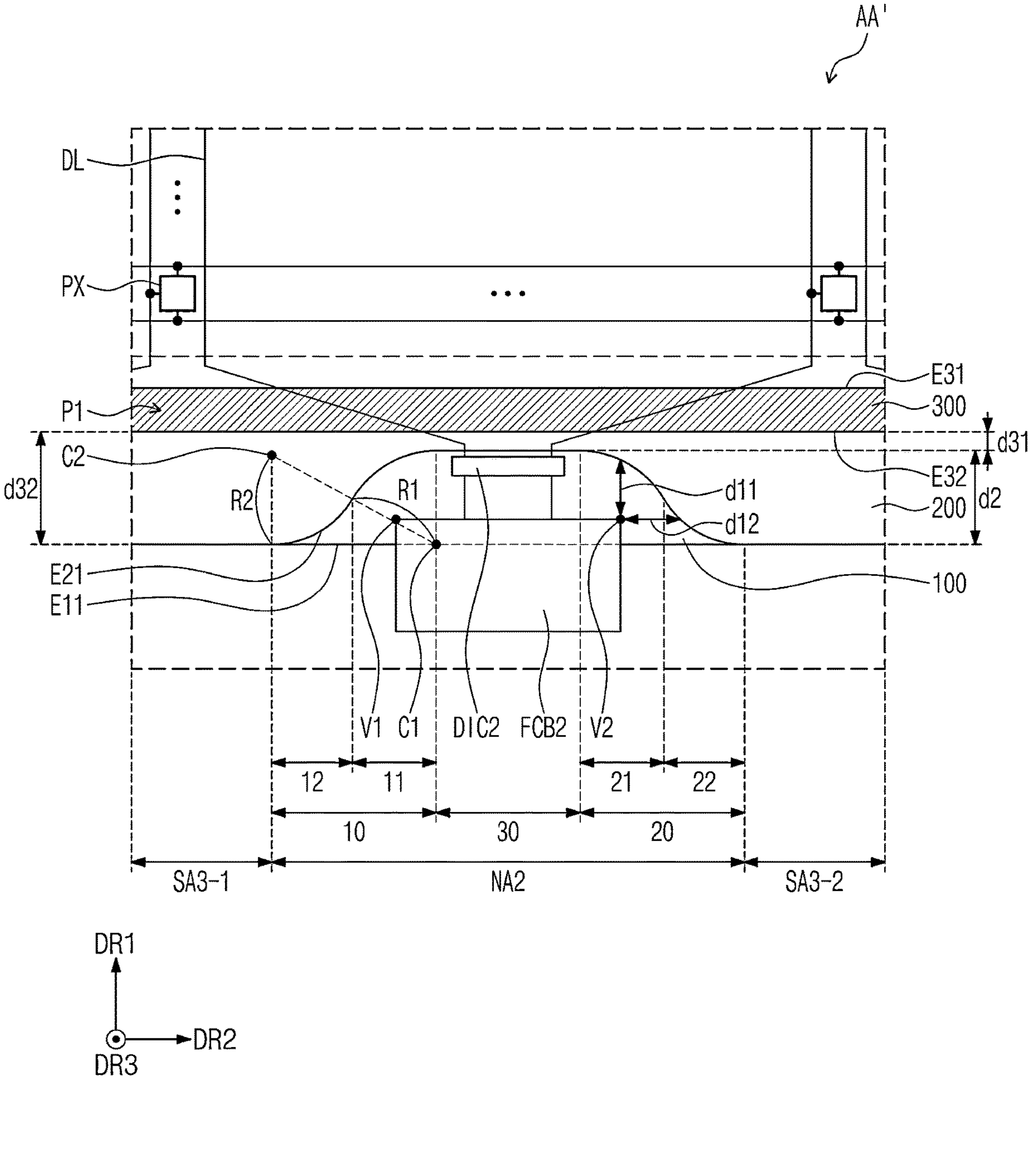
FIG. 6 is an enlarged plan view of an embodiment of some components of an electronic panel in an area AA' of FIG. 4 according to the disclosure.

FIG. 4 is a plan view of an embodiment of some components of the electronic panel EP according to the disclosure. FIG. 5 is an exploded perspective view of an embodiment of the display panel DP according to the disclosure. FIG. 6 is an enlarged plan view of an embodiment of some components of the electronic panel EP in an area AA' of FIG. 4 according to the disclosure. FIGS. 4 to 6 show the display panel DP, the driving circuits DIC, and the flexible circuit boards FCB of the electronic panel EP.

Referring to FIGS. 4 and 5, the lower substrate 100 may include a scan driver GDC, a plurality of signal lines SGL, and a plurality of pixels PX.

The scan driver GDC may generate a plurality of scan signals and may sequentially output the scan signals to a plurality of scan lines GL described later. The scan driver GDC may further output another control signal to the driving circuit of the pixels PX.

The scan driver GDC may include a plurality of thin film transistors formed through the same processes, e.g., a low temperature polycrystalline silicon ("LTPS") process or a low temperature polycrystalline oxide ("LTPO") process, as the driving circuit of the pixels PX.

The signal lines SGL may include the scan lines GL, data lines DL, a power line PL, and a control signal line CSL. Each of the scan lines GL may be connected to a corresponding pixel among the pixels PX, and each of the data lines DL may be connected to a corresponding pixel among the pixels PX. The power line PL may be connected to the pixels PX. The control signal line CSL may be connected to the scan driver GDC and may provide control signals to the scan driver GDC.

The data lines DL may be connected to the driving circuits DIC and the flexible circuit boards FCB. In the disclosure, the driving circuits DIC may be data driving circuits.

Among the data lines DL, some data lines disposed at a left side may be connected to the first driving circuit DIC1 and the first pad portion PD1 (refer to FIG. 2B) and may be electrically connected to the first flexible circuit board FCB1 and the main circuit board MCB (refer to FIG. 2B) via the first pad portion PD1 (refer to FIG. 2B).

Among the data lines DL, some data lines disposed at a center may be connected to the second driving circuit DIC2 and the second pad portion PD2 (refer to FIG. 2B) and may be electrically connected to the second flexible circuit board FCB2 and the main circuit board MCB (refer to FIG. 2B) via the second pad portion PD2 (refer to FIG. 2B).

Among the data lines DL, some data lines disposed at a right side may be connected to the third driving circuit DIC3 and the third pad portion PD3 (refer to FIG. 2B) and may be electrically connected to the third flexible circuit board FCB3 and the main circuit board MCB (refer to FIG. 2B) via the third pad portion PD3 (refer to FIG. 2B).

The power line PL may be connected to the third pad portion PD3 (refer to FIG. 2B) and may be electrically connected to the third flexible circuit board FCB3 and the main circuit board MCB (refer to FIG. 2B). The power line PL may be electrically connected to the voltage generator of the main circuit board MCB (refer to FIG. 2B) and may provide a reference voltage to the pixels PX.

The control signal line CSL may be connected to the scan driver GDC. The control signal line CSL may be connected to the first pad portion PD1 (refer to FIG. 2B) and may be electrically connected to the first flexible circuit board FCB1 and the main circuit board MCB.

The lower substrate 100 may have a quadrangular (e.g., rectangular) shape. The lower substrate 100 may include an upper surface U-100 facing the upper substrate 200, a lower surface L-100 opposite to the upper surface U-100, and a side surface S-100 connecting the upper surface U-100 and the lower surface L-100.

The lower substrate 100 may include first, second, third, and fourth edges E11, E12, E13, and E14. The first, second, third, and fourth edges E11, E12, E13, and E14 may be defined as corners formed by the upper surface U-100 and the side surface S-100 of the lower substrate 100. That is, the first, second, third, and fourth edges E11, E12, E13, and E14 may be corners defining a shape of the lower substrate 100 in a direction facing the upper surface U-100 of the lower substrate 100.

The first edge E11 may extend in the second direction DR2 and may be adjacent to the flexible circuit boards FCB. The second edge E12 may extend in the second direction DR2 and may be spaced apart from the first edge E11 in the first direction DR1.

The third edge E13 may extend from one end of the first edge E11 to one end of the second edge E12 along the first direction DR1. The third edge E13 may be adjacent to the scan driver GDC. The fourth edge E14 may extend from an opposite end of the first edge E11 to an opposite end of the second edge E12 along the first direction DR1 and may be spaced apart from the third edge E13 in the second direction DR2.

The upper substrate 200 may include a lower surface L-200 facing the lower substrate 100, an upper surface U-200 opposite to the lower surface L-200, and a side surface S-200 connecting the lower surface L-200 and the upper surface U-200.

The upper substrate 200 may include fifth, sixth, seventh, and eighth edges E21, E22, E23, and E24. The fifth, sixth, seventh, and eighth edges E21, E22, E23, and E24 may be defined as corners formed by the upper surface U-200 and the side surface S-200 of the upper substrate 200. That is, the fifth, sixth, seventh, and eighth edges E21, E22, E23, and E24 may be corners defining a shape of the upper substrate 200 in a direction facing the upper surface U-200 of the upper substrate 200.

The fifth edge E21 may correspond to the first edge E11. Hereinafter, the first edge E11 will be also referred to as a lower edge E11, and the fifth edge E21 will be also referred to as an upper edge E21. The upper edge E21 may include a notch area NA and a straight area SA. In the illustrated embodiment, each of the notch area NA and the straight area SA may be provided in a plural number.

The notch areas NA may respectively correspond to the notches NC. That is, each of the notch areas NA may define a corresponding notch among the notches NC. In an embodiment, the notch areas NA may include a first notch area NA1 corresponding to the first notch N1, a second notch area NA2 corresponding to the second notch N2, and a third notch area NA3 corresponding to the third notch N3. A shape of the notch areas NA will be described below.

The straight areas SA may include a first straight area SA1, a second straight area SA2, and at least one third straight area SA3.

The first straight area SA1 may extend from the first notch area NA1, which is disposed at a leftmost position among the notch areas NA, to a direction opposite to the second direction DR2 to be spaced away from at least one third straight area SA3 with respect to the second direction DR2.

The second straight area SA2 may extend from the third notch area NA3, which is disposed at a rightmost position among the notch areas NA, to the second direction DR2 to be spaced away from a least one third straight area SA3 with respect to the second direction DR2.

The at least one third straight area SA3 may be disposed between the notch areas NA adjacent to each other among the notch areas NA. In an embodiment, the third straight areas SA3 may include a first sub-area SA3-1 disposed between the first notch area NA1 and the second notch area NA2 and a second sub-area SA3-2 disposed between the second notch area NA2 and the third notch area NA3.

In the illustrated embodiment, each of the first, second, and third straight areas SA1, SA2, and SA3 may extend in the second direction DR2. Each of the first, second, and third straight areas SA1, SA2, and SA3 may be aligned with the lower edge E11.

In an embodiment, when the first flexible circuit board FCB1 is disposed adjacent to the third edge E13 of the lower substrate 100, the first straight area SA1 may be omitted, and when the third flexible circuit board FCB3 is disposed adjacent to the fourth edge E14 of the lower substrate 100, the second straight area SA2 may be omitted. In this case, one of the first straight area SA1 and the second straight area SA2 may be omitted, or all the first straight area SA1 and the second straight area SA2 may be omitted.

The sixth edge E22 may correspond to the second edge E12. The sixth edge E22 may extend in the second direction DR2 and may be spaced apart from the upper edge E21 in the first direction DR1. In the illustrated embodiment, the sixth edge E22 may be aligned with the second edge E12.

The seventh edge E23 may correspond to the third edge E13. The seventh edge E23 may extend from one end of the upper edge E21 to one end of the sixth edge E22 along the first direction DR1. In the illustrated embodiment, the seventh edge E23 may be aligned with the third edge E13.

The eighth edge E24 may correspond to the fourth edge E14. The eighth edge E24 may extend from an opposite end of the upper edge E21 to an opposite end of the sixth edge E22 along the first direction DR1. The eighth edge E24 may be spaced apart from the seventh edge E23 in the second direction DR2. In the illustrated embodiment, the eighth edge E24 may be aligned with the fourth edge E14.

According to the disclosure, a portion of the peripheral area NAA of the lower substrate 100 may be exposed through the notch areas NA of the upper edge E21 without being covered by the upper substrate 200. Accordingly, areas to which the driving circuits DIC and the flexible circuit boards FCB are attached may be secured in the lower substrate 100.

Different from the disclosure, in a case where the notches NC are not defined in the upper edge E21 of the upper substrate 200 and an entire portion of the upper edge E21 extends in a straight line along the second direction DR2 and is closer to the active area AA (refer to FIG. 2B) than the lower edge E11 is, an end portion of the lower substrate 100, which includes the lower edge E11, is entirely exposed without being covered by the upper substrate 200.

The portion exposed without being covered by the upper substrate 200 may be provided as a single-layer substrate including only the lower substrate 100, and a rigidity of the portion to which the flexible circuit boards FCB is not attached may be substantially low due to the thin thickness of the lower substrate 100. Accordingly, an end portion of the lower substrate 100 may be easily cracked by external impacts during manufacturing and transportation of the display device DD. The cracking of the lower substrate 100 may cause damage to the pads PDD (refer to FIG. 2B) disposed on the lower substrate 100 or the driving circuits DIC disposed (e.g., mounted) on the lower substrate 100, and defects may occur in the electronic panel EP.

In contrast, according to the disclosure, as the first, second, and third straight areas SA1, SA2, and SA3 of the upper edge E21 may be aligned with the lower edge E11, a portion of the peripheral area NAA of the lower substrate 100, which does not overlap the notches NC, may be covered by the upper substrate 200. The area exposed without being covered by the upper substrate 200 may decrease in the end portion of the lower substrate 100, which includes the lower edge E11. As the portion implemented by two-layer substrate is expanded, the rigidity of the end portion of the lower substrate 100 may increase.

Accordingly, the upper substrate 200 may protect the lower substrate 100 from external impacts, and thus, the lower substrate 100 may be prevented from being cracked. Therefore, the pads PDD (refer to FIG. 2B) or the driving circuits DIC may be prevented from being damaged, and a reliability of the electronic panel EP and the display device DD (refer to FIG. 1) including the electronic panel EP may be improved.

In the illustrated embodiment, the coupling member 300 may overlap the peripheral area NAA and may have a closed loop shape surrounding the active area AA. The coupling member 300 may have a quadrangular band shape. The coupling member 300 may include a first portion P1, a second portion P2, a third portion P3, and a fourth portion P4. The first portion P1, the second portion P2, the third portion P3, and the fourth portion P4 may respectively correspond to the lower edge E11, the second edge E12, the third edge E13, and the fourth edge E14.

The first portion P1 may be disposed adjacent to the lower edge E11 of the lower substrate 100. The first portion P1 may include a first coupling edge E31 adjacent to the active area AA and a second coupling edge E32 opposite to the first coupling edge E31 in the first direction DR1 and disposed adjacent to the upper edge E21. Each of the first coupling edge E31 and the second coupling edge E32 may extend in a straight shape along the second direction DR2. That is, each of the first coupling edge E31 and the second coupling edge E32 may be substantially parallel to the lower edge E11. Accordingly, all portions of the coupling member 300, which correspond to the notch areas NA and the straight areas SA of the upper edge E21, may extend in the second direction DR2. In other words, all portions of the coupling member 300, which are adjacent to the notch areas NA and the straight areas SA of the upper edge E21, may extend in the second direction DR2.

The first portion P1 may be disposed closer to the active area AA than the upper edge E21 is. In the illustrated embodiment, a minimum separation distance between the first portion P1 and the corresponding notch area among the notch areas NA may be smaller than a minimum separation distance between the first portion P1 and the corresponding straight area among the straight areas SA in a plan view defined by the first direction DR1 and the second direction DR2. In an embodiment, the separation distance between the first portion P1 and the corresponding notch area may be equal to or greater than about 100 micrometers and equal to or smaller than about 1000 micrometers.

The second portion P2 may be disposed adjacent to the second edge E12 of the lower substrate 100. The second portion P2 may be spaced apart from the first portion P1 in the first direction DR1. The third portion P3 may be disposed adjacent to the third edge E13 of the lower substrate 100. The third portion P3 may extend from one end of the first portion P1 to one end of the second portion P2 along the first direction DR1. The fourth portion P4 may be disposed adjacent to the fourth edge E14 of the lower substrate 100. The fourth portion P4 may be spaced apart from the third portion P3 in the second direction DR2.

FIG. 6 is an enlarged plan view of an embodiment of some components of the electronic panel EP in an area AA' of FIG. 4 according to the disclosure. Hereinafter, the shape of the notch areas NA will be described in detail based on the second notch area NA2. Descriptions about the shape of the second notch area NA2 may be applied to the first notch area NA1 (refer to FIG. 4) and the third notch area NA3 (refer to FIG. 4).

Referring to FIG. 6, the second notch area NA2 may include a first area 10, a second area 20, and a third area 30.

The first area 10 and the second area 20 may be arranged in the second direction DR2 with the third area 30 interposed therebetween. The first area 10 and the second area 20 may face each other in the second direction DR2. In the illustrated embodiment, each of the first area 10 and the second area 20 may be defined as a portion with a curvature.

The third area 30 may be disposed between the first area 10 and the second area 20. The third area 30 may extend from the first area 10 to the second area 20 along the second direction DR2. In the disclosure, the third area 30 may be defined as a portion without a curvature.

In an embodiment, the second driving circuit DIC2 may be disposed between the third area 30 and the second flexible circuit board FCB2 in a plan view, and a length, in the second direction DR2, of the third area 30 may be equal to or greater than a length, in the second direction DR2, of the second driving circuit DIC2.

The first area 10 may include a first one end portion 11 (or one end portion of the first area 10) and a first other end portion 12 (or an opposite end portion of the first area 10). The first one end portion 11 may be adjacent to the third area 30, and the first other end portion 12 may be adjacent to the straight area, e.g., the first sub-area SA3-1. In an embodiment, the first one end portion 11 may be a portion extending from one end of the third area 30. The first other end portion 12 may be a portion extending from the first sub-area SA3-1.

The second area 20 may include a second one end portion 21 (or one end portion of the second area 20) and a second other end portion 22 (or an opposite end portion of the second area 20). The second one end portion 21 may be adjacent to the third area 30, and the second other end portion 22 may be adjacent to the straight area, e.g., the second sub-area SA3-2. In an embodiment, the second one end portion 21 may be a portion extending from an opposite end of the third area 30, which faces the one end of the third area 30, in the second direction DR2. The second other end portion 22 may be a portion extending from the second sub-area SA3-2.

In the illustrated embodiment, each of the first one end portion 11, the second one end portion 21, the first other end portion 12, and the second other end portion 22 may have a predetermined curvature.

A curvature center C1 of each of the first one end portion 11 and the second one end portion 21 may be disposed outside the upper substrate 200. In an embodiment, the curvature center C1 of each of the first one end portion 11 and the second one end portion 21 may overlap the second notch N2 (refer to FIG. 4) or may not overlap the second notch N2.

A curvature center C2 of each of the first other end portion 12 and the second other end portion 22 may be disposed inside the upper substrate 200.

A distance in the second direction DR2 between the first area 10 and the second area 20 may increases as a distance from the lower edge E11 decreases. Since a length, in the second direction DR2, of the second flexible circuit board FCB2 is greater than a length, in the second direction DR2, of the second driving circuit DIC2 and the second driving circuit DIC2 is disposed adjacent to the third area 30 than the second flexible circuit board FCB2 is, an exposed area of an inner portion in which the second driving circuit DIC2 is disposed may be reduced. That is, as the area where the single-layer substrate is provided is reduced, the rigidity of the display panel DP (refer to FIG. 2A) may increase, and the display panel DP (refer to FIG. 2A) may be prevented from being cracked due to the external impacts.

In the illustrated embodiment, each of the first one end portion 11 and the second one end portion 21 may be defined to allow the curvature center C1 to be disposed outside the upper substrate 200, and each of the first other end portion 12 and the second other end portion 22 may be defined to allow the curvature center C2 to be disposed inside the upper substrate 200. Accordingly, the area in which the second driving circuit DIC2 is disposed and the area where a pressing bar bonding the second flexible circuit board FCB2 to the display panel DP is disposed may be sufficiently secured, and the exposed area of the lower substrate 100 may be reduced.

Different from the disclosure, in a case where the first area 10 and the second area 20 have a single curvature, an increase rate of the distance in the first direction DR1 decreases as a distance from the lower edge E11 decreases, and as a result, the area where the pressing bar is disposed may not be sufficiently secured. Accordingly, since an increase in the length of the third area 30 is desired to sufficiently secure the area where the pressing bar is disposed, the exposed area of the lower substrate 100 may increase.

In an embodiment, a radius of curvature R1 of the first one end portion 11 may be substantially the same as a radius of curvature R2 of the first other end portion 12. Each of the radius of curvature R1 of the first one end portion 11 and the radius of curvature R2 of the first other end portion 12 may be equal to or greater than about 1 millimeter (mm) and equal to or smaller than about 10 mm.

The second one end portion 21 may have the same radius of curvature as a radius of curvature of the second other end portion 22. Each of the radius of curvature of the second one end portion 21 and the radius of curvature of the second other end portion 22 may be equal to or greater than about 1 mm and equal to or smaller than about 10 mm.

FIG. 6 shows a structure in which a length of the first one end portion 11 is equal to a length of the first other end portion 12 and a length of the second one end portion 21 is equal to a length of the second other end portion 22 in the second direction DR2 as an illustrative embodiment, however, the disclosure should not be limited thereto or thereby. In an embodiment, a length ratio of the first one end portion 11 to the first other end portion 12 and a length ratio of the second one end portion 21 to the second other end portion 22 may be determined in consideration of the area in which the second driving circuit DIC2 and the second flexible circuit board FCB2 are disposed and the area in which the pressing bar is disposed. That is, as the length ratio of the first one end portion 11 to the first other end portion 12 and the length ratio of the second one end portion 21 to the second other end portion 22 are controlled, the area of the lower substrate 100 exposed without being covered by the upper substrate 200 may be designed in various ways.

Vertices overlapping the lower substrate 100 among vertices of the second flexible circuit board FCB2 may be also referred to as a first vertex V1 and a second vertex V2, respectively. The first vertex V1 may be disposed adjacent to the first area 10, and the second vertex V2 may be disposed adjacent to the second area 20.

In the plan view, a separation distance in the first direction DR1 between the first vertex V1 and the second notch area NA2 may be the same as a separation distance in the second direction DR2 between the first vertex V1 and the second notch area NA2. In an embodiment, the first vertex V1 may be spaced apart from the first one end portion 11 in the first direction DR1 and may be spaced apart from the first other end portion 12 in the second direction DR2. In this case, a separation distance in the first direction DR1 between the first vertex V1 and the first one end portion 11 may be the same as a separation distance in the second direction DR2 between the first vertex V1 and the first other end portion 12.

In the plan view, a separation distance d11 in the first direction DR1 between the second vertex V2 and the second notch area NA2 may be the same as a separation distance d12 in the second direction DR2 between the second vertex V2 and the second notch area NA2. In an embodiment, the second vertex V2 may be spaced apart from the second one end portion 21 in the first direction DR1 and may be spaced apart from the second other end portion 22 in the second direction DR2. In this case, a separation distance d11 in the first direction DR1 between the second vertex V2 and the second one end portion 21 may be the same as a separation distance d12 in the second direction DR2 between the second vertex V2 and the second other end portion 22.

In the plan view, a separation distance d2 from the lower edge E11 to the third area 30, i.e., a depth of the second notch N2, may be equal to or greater than about 0.5 mm and equal to or smaller than about 10 mm, however, it should not be limited thereto or thereby. In an embodiment, the depth of the second notch N2 may be changed depending on the type of the display device DD (refer to FIG. 1), a size of the second flexible circuit board FCB2, or the like.

In the illustrated embodiment, the first portion P1 of the coupling member 300 may be disposed closer to the active area AA (refer to FIG. 4) than the upper edge E21 is. In the illustrated embodiment, a minimum separation distance d31 between the first portion P1 and the corresponding notch area (e.g., the second notch area NA2) may be smaller than a minimum separation distance d32 between the first portion P1 and the corresponding straight area (e.g., the first sub-area SA3-1 or the second sub-area SA3-2) in the plan view. In an embodiment, the minimum separation distance d31 between the first portion P1 and the corresponding notch area, i.e., a separation distance between the first portion P1 and the third area 30, may be equal to or greater than about 100 micrometers and equal to or smaller than about 1000 micrometers.

In the illustrated embodiment, the first portion P1 may be disposed closer to the active area AA (refer to FIG. 4) than an imaginary line extending in the second direction DR2 along the third areas 30 of each of the first, second, and third notch areas NA1, NA2, and NA3 (refer to FIG. 4) is in the plan view.

Figure 7:
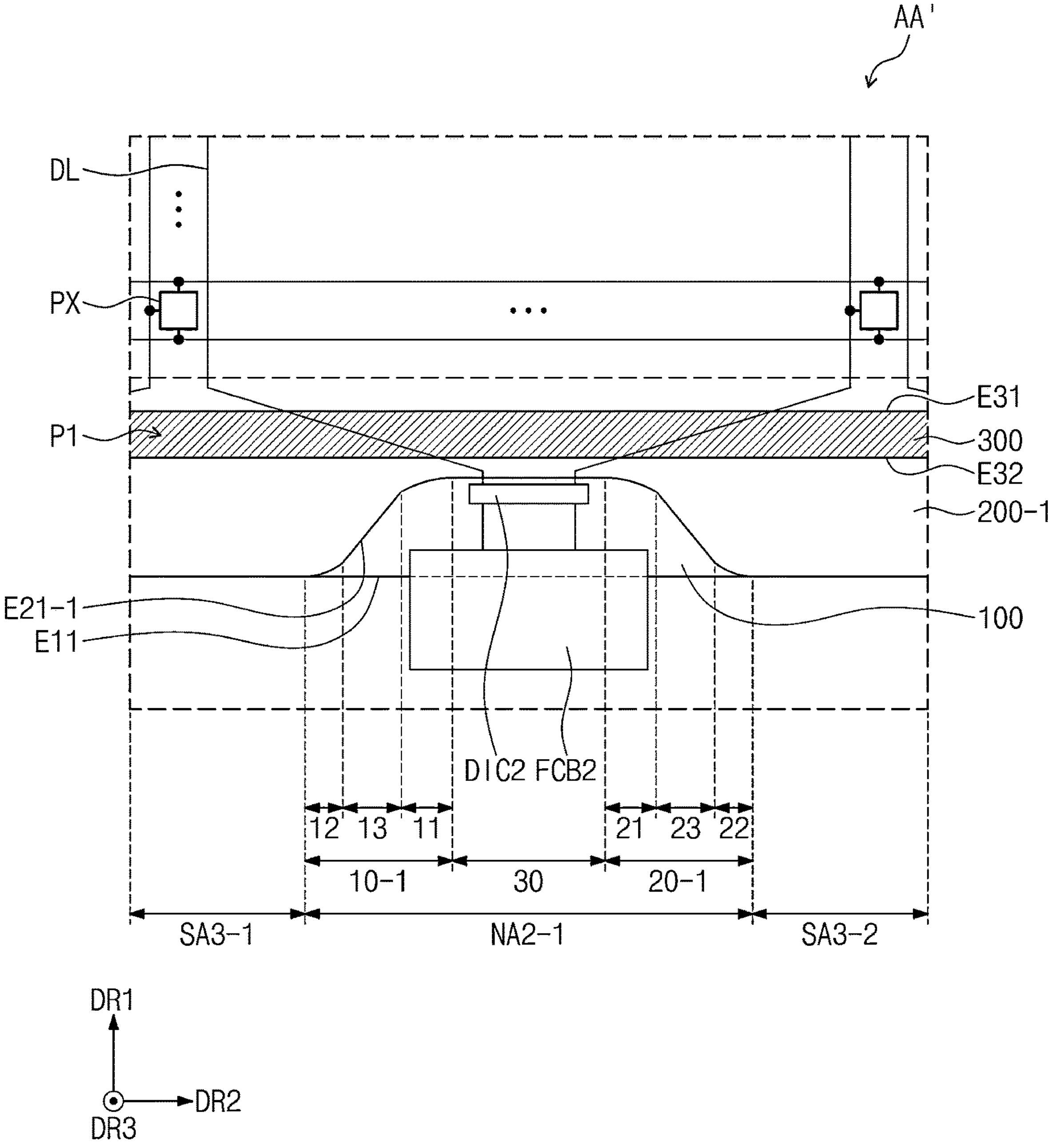
FIG. 7 is an enlarged plan view of an embodiment of some components of an electronic panel in an area AA' of FIG. 4 according to the disclosure.

FIG. 7 is an enlarged plan view of an embodiment of some components of an electronic panel EP in an area AA' of FIG. 4 according to the disclosure. FIG. 7 shows a second notch area NA2-1 of an upper edge E21-1 of an upper substrate 200-1, and descriptions about a shape of the second notch area NA2-1 may be applied to the first notch area NA1 (refer to FIG. 4) and the third notch area NA3 (refer to FIG. 4). In FIG. 7, the same/similar reference numerals denote the same/similar elements in FIGS. 1 to 6, and thus, detailed descriptions of the same/similar elements will be omitted.

Referring to FIG. 7, the second notch area NA2-1 may include a first area 10-1, a second area 20-1, and a third area 30.

The first area 10-1 and the second area 20-1 may face each other in the second direction DR2. In the illustrated embodiment, a portion of each of the first area 10-1 and the second area 20-1 may have a curvature. The third area 30 may be disposed between the first area 10-1 and the second area 20-1. The third area 30 may not have the curvature and may extend in the second direction DR2.

The first area 10-1 may include a first one end portion 11, a first other end portion 12, and a first extension portion 13. The first one end portion 11 may extend from one end of the third area 30, and the first other end portion 12 may extend from a straight area, e.g., a first sub-area SA3-1. The first extension portion 13 may be disposed between the first one end portion 11 and the first other end portion 12.

The second area 20-1 may include a second one end portion 21, a second other end portion 22, and a second extension portion 23. The second one end portion 21 may extend from an opposite end of the third area 30, and the second other end portion 22 may extend from a straight area, e.g., a second sub-area SA3-2. The second extension portion 23 may be disposed between the second one end portion 21 and the second other end portion 22.

Each of the first one end portion 11, the second one end portion 21, the first other end portion 12, and the second other end portion 22 may have a predetermined curvature. Each of a curvature center of the first one end portion 11 and a curvature center of the second one end portion 21 may not overlap the upper substrate 200. Each of the curvature center of the first other end portion 12 and the curvature center of the second other end portion 22 may overlap the upper substrate 200. Detailed descriptions of each of the first one end portion 11, the second one end portion 21, the first other end portion 12, and the second other end portion 22 has been described above with reference to FIG. 6, and thus, details thereof will be omitted below.

In the illustrated embodiment, each of the first extension portion 13 and the second extension portion 23 may not have the curvature.

The first extension portion 13 may extend from one end of the first one end portion 11 spaced apart from the third area 30 to one end of the first other end portion 12 spaced apart from the first sub-area SA3-1 in a straight line.

The second extension portion 23 may extend from one end of the second one end portion 21 spaced apart from the third area 30 to one end of the second other end portion 22 spaced apart from the second sub-area SA3-2.

FIG. 7 shows a structure in which the first extension portion 13 and the second extension portion 23 respectively extend in an oblique direction of the second direction DR2 and a direction crossing the oblique direction, however, the disclosure should not be limited thereto or thereby. In an embodiment, the first extension portion 13 and the second extension portion 23 may extend in the second direction DR2.

As the electronic panel further includes a straight portion between the first one end portion 11 and the first other end portion 12 and between the second one end portion 21 and the second other end portion 22, an area of the lower substrate 100 exposed without being covered by the upper substrate 200-1 may be designed in various ways.

In addition, in an embodiment, a portion with one or more curvatures and straight-shaped portions may be further provided between the first one end portion 11 and the first other end portion 12 and between the second one end portion 21 and the second other end portion 22.

Figure 8:
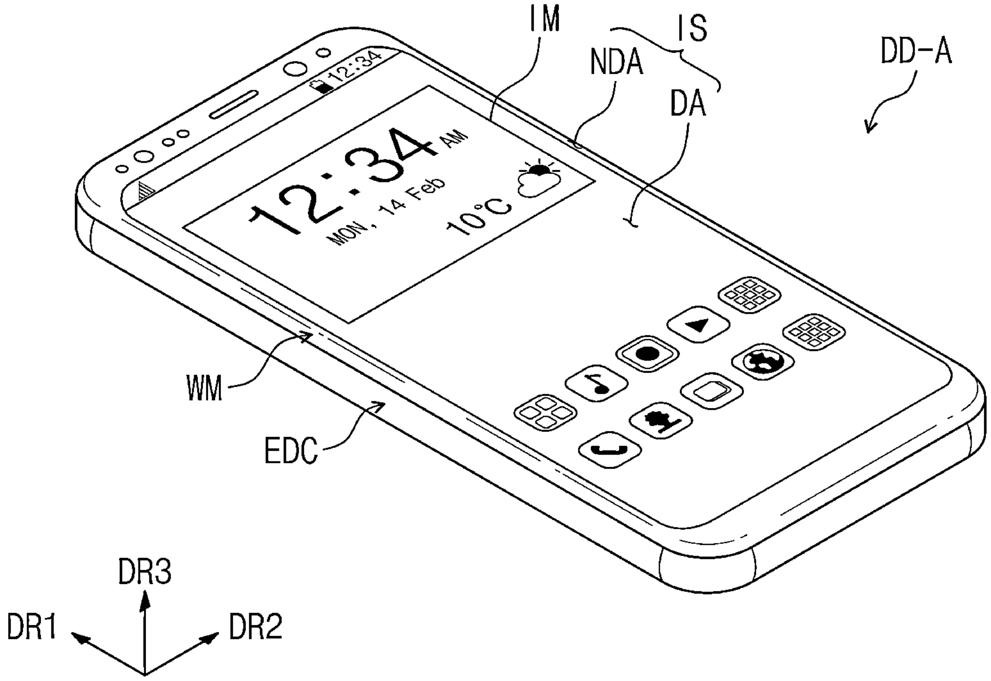
FIG. 8 is a perspective view of an embodiment of a display device according to the disclosure.
Figure 9:
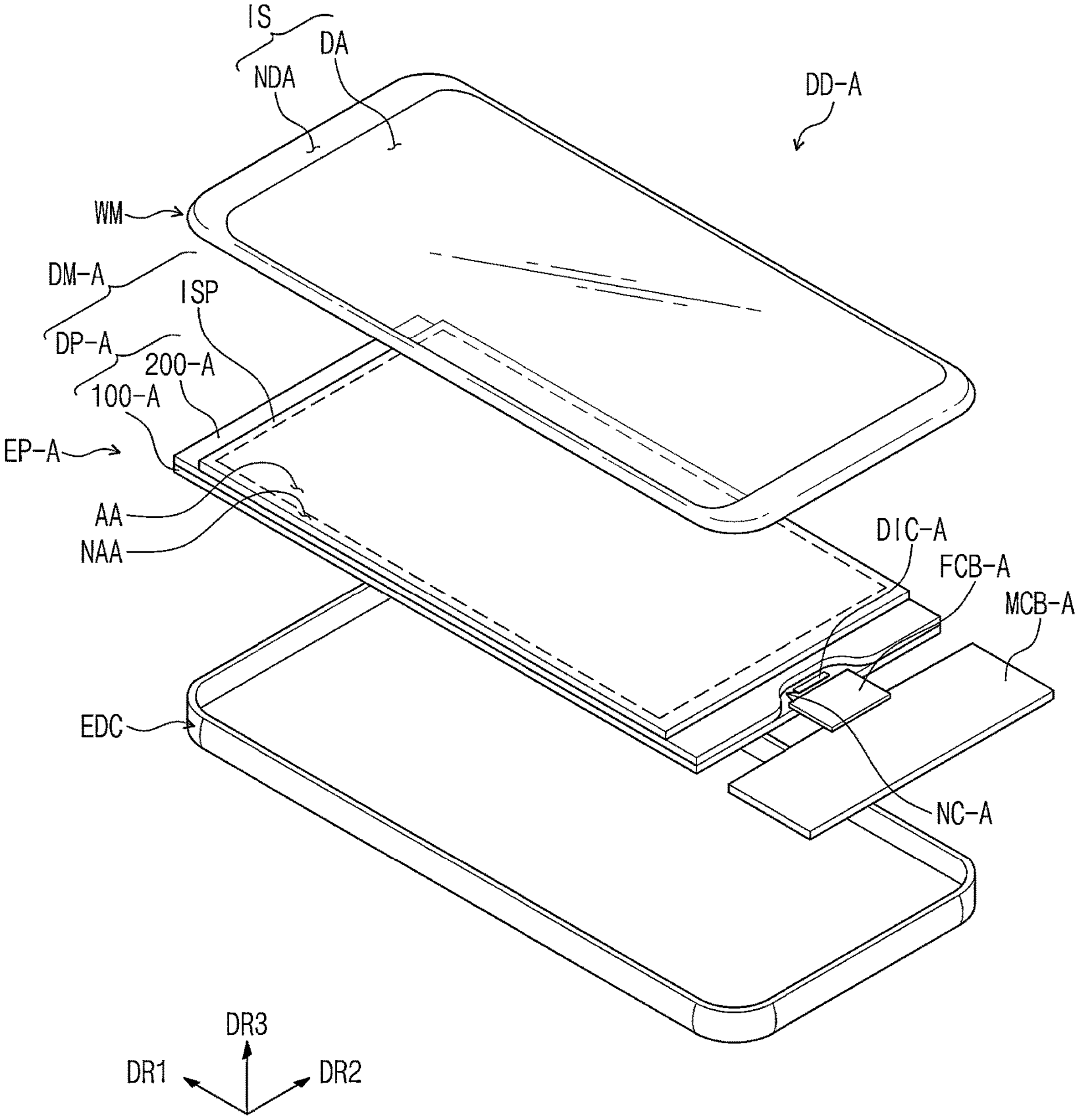
FIG. 9 is an exploded perspective view of an embodiment of a display device according to the disclosure.
Figure 10:
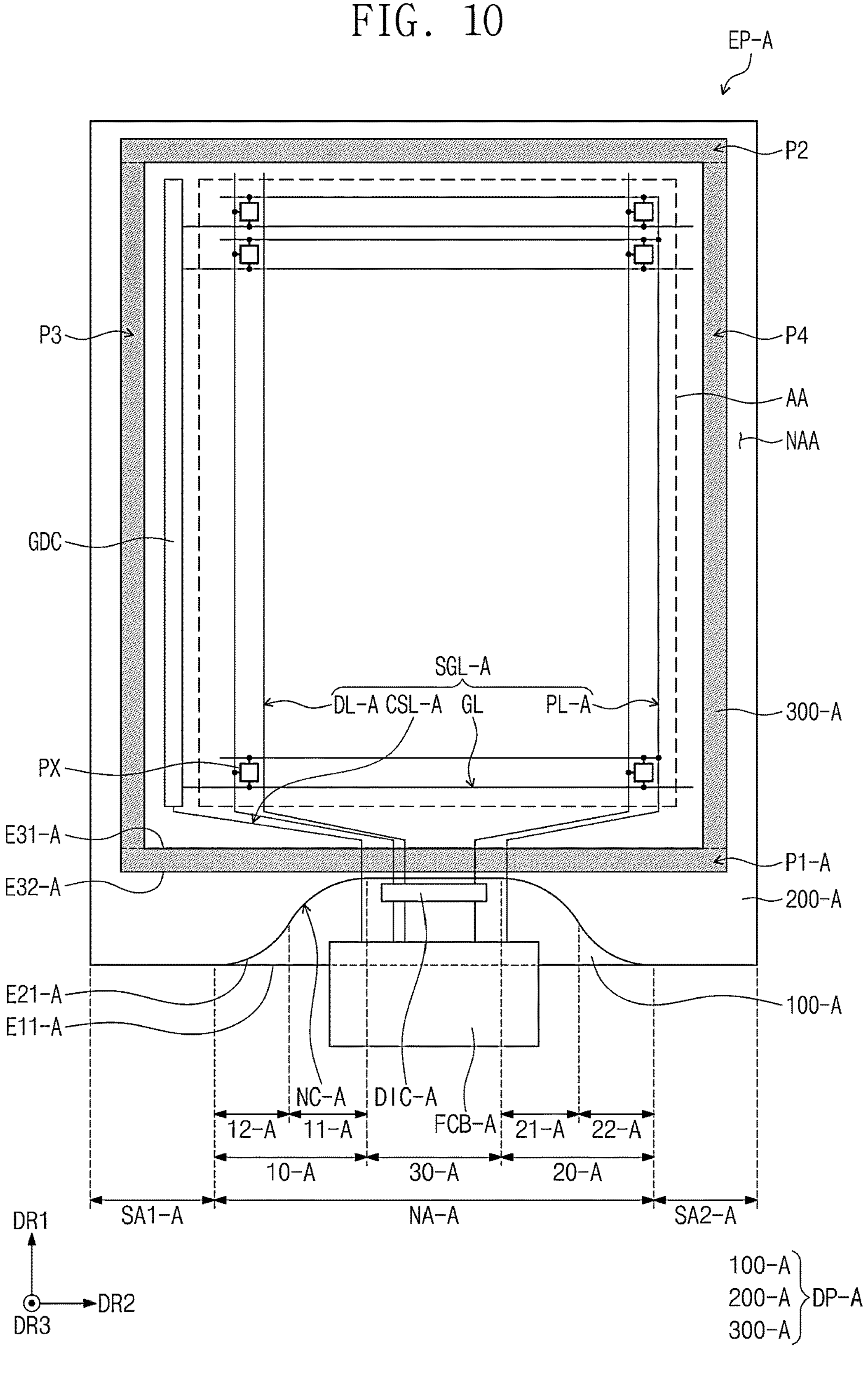
FIG. 10 is a plan view of an embodiment of some components of an electronic panel according to the disclosure.

FIG. 8 is a perspective view of an embodiment of a display device DD-A according to the disclosure. FIG. 9 is an exploded perspective view of an embodiment of the display device DD-A according to the disclosure. FIG. 10 is a plan view of an embodiment of some components of an electronic panel EP-A according to the disclosure. The smartphone will be described as the display device DD-A in FIGS. 8 to 10. In FIGS. 8 to 10, the same/similar reference numerals denote the same/similar elements in FIGS. 1 to 7, and thus, detailed descriptions of the same/similar elements will be omitted.

Referring to FIGS. 8 and 9, the display device DD-A may have a quadrangular (e.g., rectangular) shape with long sides extending in the first direction DR1 and short sides extending in the second direction DR2, however, the shape of the display device DD-A should not be limited to the quadrangular (e.g., rectangular) shape and may have a variety of shapes.

The display device DD-A may include an electronic panel EP-A, a window WM, and an external case EDC. The electronic panel EP-A may include a display module DM-A, a driving circuit DIC-A, a flexible circuit board FCB-A, and a main circuit board MCB-A.

The display module DM-A may include a display panel DP-A and an input sensing panel ISP, and the display panel DP-A may include a lower substrate 100-A, an upper substrate 200-A, and a coupling member 300-A. The lower substrate 100-A may include a base substrate BS (refer to FIG. 3), a display circuit layer CL (refer to FIG. 3) disposed on the base substrate BS (refer to FIG. 3), and a display element layer ED (refer to FIG. 3) disposed on the display circuit layer CL (refer to FIG. 3). The upper substrate 200-A may be disposed on the lower substrate 100-A and may cover the pixels PX (refer to FIG. 10). In the illustrated embodiment, the upper substrate 200-A may include one notch NC-A defined therein. The upper substrate 200-A may be coupled with the lower substrate 100-A by the coupling member 300-A. The input sensing panel ISP may be disposed on the upper substrate 200-A.

In the illustrated embodiment, the display device DD-A may include one driving circuit DIC-A and one flexible circuit board FCB-A.

The driving circuit DIC-A may be disposed in the peripheral area NAA of the lower substrate 100-A. The driving circuit DIC-A may be disposed in an area of the lower substrate 100-A without being covered by the upper substrate 200-A. That is, the driving circuit DIC-A may overlap the notch NC-A.

The flexible circuit board FCB-A may be connected to the lower substrate 100-A. One end of the flexible circuit board FCB-A may be disposed in a peripheral area NAA of the lower substrate 100-A and may overlap the notch NC-A.

The main circuit board MCB-A may be connected to the flexible circuit board FCB-A. The main circuit board MCB-A may be connected to the flexible circuit board FCB-A and may be electrically connected to the display panel DP-A.

FIG. 10 is a plan view of the display panel DP-A, the driving circuit DIC-A, and the flexible circuit board FCB-A of the electronic panel EP-A.

Referring to FIG. 10, the display panel DP-A may include the lower substrate 100-A, the upper substrate 200-A, and the coupling member 300-A. The lower substrate 100-A may include a scan driver GDC, signal lines SGL-A, and pixels PX. The signal lines SGL-A may include scan lines GL, data lines DL-A, power line PL-A, and a control signal line CSL-A. In the illustrated embodiment, all the data lines DL-A may be connected to one driving circuit DIC-A and one flexible circuit board FCB-A. The power line PL-A and the control signal line CSL-A may be connected to the same flexible circuit board FCB-A. The signal lines SGL-A are described in detail with reference to FIG. 4, and thus, details thereof will be omitted in the illustrated embodiment.

An upper edge E21-A may include a notch area NA-A, a first straight area SA1-A, and a second straight area SA2-A. The notch area NA-A may include a first area 10-A, a second area 20-A, and a third area 30-A.

The first area 10-A and the second area 20-A may face each other in the second direction DR2, and each of the first area 10-A and the second area 20-A may include a curvature. The third area 30-A may be disposed between the first and second areas 10-A and 20-A, may not have the curvature, and may extend in the second direction DR2.

The first area 10-A may include a first one end portion 11-A and a first other end portion 12-A. The first one end portion 11-A may extend from one end of the third area 30-A, and the first other end portion 12-A may extend from the first straight area SA1-A.

The second area 20-A may include a second one end portion 21-A and a second other end portion 22-A. The second one end portion 21-A may extend from an opposite end of the third area 30-A, and the second other end portion 22-A may extend from the second straight area SA2-A.

A curvature center of each of the first one end portion 11-A and the second one end portion 21-A may not overlap the upper substrate 200-A. A curvature center of each of the first other end portion 12-A and the second other end portion 22-A may overlap the upper substrate 200-A.

The first straight area SA1-A may extend from the first other end portion 12-A of the first area 10-A. The first straight area SA1-A may have a straight shape and may extend in the second direction DR2. The second straight area SA2-A extending in the second other end portion 22-A of the second area 20-A. The second straight area SA2-A may have a straight shape extending in the second direction DR2.

In the illustrated embodiment, each of the first straight area SA1-A and the second straight area SA2-A may be aligned with the lower edge E11-A. Accordingly, a portion of the peripheral area NAA of the lower substrate 100-A, which does not overlap the notch NC-A, may be entirely covered by the upper substrate 200-A, and thus, the area without being covered by the upper substrate 200-A in an end portion including the lower edge E11-A of the lower substrate 100-A may be reduced.

Accordingly, the upper substrate 200-A may protect the lower substrate 100-A from external impacts and may prevent the lower substrate 100-A from being cracked. The reliability of the electronic panel EP-A and the reliability of the display device DD-A (refer to FIG. 8) may be improved.

The coupling member 300-A may have a closed loop shape. The coupling member 300-A may have a quadrangular band shape. The coupling member 300-A may include first, second, third, and fourth portions P1-A, P2, P3, and P4. The first portion P1-A may correspond to the lower edge E11-A. In other words, the first portion P1-A may be disposed adjacent to the lower edge E11-A. The first portion P1-A may include a first coupling edge E31-A and a second coupling edge E32-A facing the first coupling edge E31-A in the first direction DR1, and each of the first coupling edge E31-A and the second coupling edge E32-A may have a straight shape extending in the second direction DR2. That is, each of the first coupling edge E31-A and the second coupling edge E32-A may be substantially parallel to the lower edge E11-A.

The first portion P1-A may be disposed closer to the active area AA than the upper edge E21-A is. In the plan view, a minimum separation distance between the first portion P1-A and the first and second straight areas SA1-A and SA2-A may be greater than a minimum separation distance between the first portion P1-A and the notch area NA-A.

In the plan view, the first portion P1-A may be disposed closer to the active area AA than an imaginary line extending in the second direction DR2 along the third area 30-A of the notch area NA-A is.

Although the embodiments of the disclosure have been described, it is understood that the disclosure should not be limited to these embodiments but various changes and modifications may be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims.

What is claimed is:

1. A display device comprising:

a lower substrate comprising an active area in which a pixel comprising a light-emitting element is disposed and a peripheral area adjacent to the active area, and comprising a lower edge;

a driving circuit electrically connected to the pixel and disposed in the peripheral area;

an upper substrate overlapping the active area and the peripheral area and provided with a plurality of notches defined therein and recessed in a first direction toward the active area, the upper substrate comprising:

an upper edge comprising:

notch edge portions defining the plurality of notches and each of the notch edge portions comprising:

a first edge portion;

a second edge portion facing the first edge portion in a second direction crossing the first direction; and a third edge portion disposed between the first edge portion and the second edge portion and extending in the second direction; and a straight edge portion extending from the notch portions, comprising a sub-straight edge portion being disposed between the notch edge portions adjacent to each other; and a flexible circuit board disposed in the peripheral area, wherein a portion of the peripheral area which does not overlap the plurality of notches is covered by the upper substrate, the driving circuit and the flexible circuit board overlap at least one of the plurality of notches, the driving circuit is disposed between the third edge portion and the flexible circuit board in a plan view, each of a first end portion of the first edge portion adjacent to the third edge portion and a first end portion of the second edge portion adjacent to the third edge portion has a predetermined curvature, and each of a second end portion of the first edge portion and a second end portion of the second edge portion has a predetermined curvature, wherein the lower edge corresponding to the sub-straight edge portion is aligned with the sub-straight edge portion.

2. The display device of claim 1, wherein each of a curvature center of the first end portion of the first edge portion and a curvature center of the first end portion of the second edge portion is disposed outside the upper substrate, and each of a curvature center of the second end portion of the first edge portion and a curvature center of the second end portion of the second edge portion is disposed inside the upper substrate.

3. The display device of claim 1, wherein a curvature of the first end portion of the first edge portion is equal to a curvature of the second end portion of the first edge portion, and a curvature of the first end portion of the second edge portion is equal to a curvature of the second end portion of the second edge portion.

4. The display device of claim 1, wherein the first edge portion further comprises a first extension portion which is disposed between the first end portion of the first edge portion and the second end portion of the first edge portion and extends in a straight line, and the second edge portion further comprises a second extension portion which is disposed between the first end portion of the second edge portion and the second end portion of the second edge portion and extends in a straight line.

5. The display device of claim 1, wherein a separation distance in the first direction between a vertex of the flexible circuit board overlapping the lower substrate and each of the notch edge portions is equal to a separation distance in the second direction between the vertex and each of the notch edge portions in a plan view.

6. The display device of claim 1, further comprising a coupling member coupling the lower substrate and the upper substrate, wherein portions of the coupling member, which are adjacent to the notch edge portions and the straight edge portion, extend in the second direction.

7. The display device of claim 1, wherein a length, in the second direction, of the third edge portion is equal to or greater than a length, in the second direction, of the driving circuit.

8. The display device of claim 1, further comprising a main circuit board attached to the flexible circuit board, wherein the flexible circuit board is bent with respect to an imaginary axis extending in the second direction, and the main circuit board is disposed under the lower substrate.

9. The display device of claim 1, wherein the straight edge portion comprises at least one of a first straight edge portion extending from the second end portion of the first edge portion with respect to the second direction and a second straight edge portion extending from the second end portion of the second edge portion with respect to the second direction.

10. The display device of claim 1, further comprising a main circuit board, wherein each of the driving circuit, and the flexible circuit board is provided in plural, the notches are arranged in the second direction, each of the driving circuits overlaps a corresponding notch among the notches, each of the flexible circuit boards overlaps a corresponding notch among the notches, and the main circuit board is attached to the flexible circuit boards.

11. The display device of claim 1, wherein the straight edge portion further comprises at least one of a first straight edge portion extending from the notch edge portions disposed at a leftmost position among the notch edge portions to be spaced away from the sub-straight edge portions with respect to the second direction and a second straight edge portion extending from the notch edge portions disposed at a rightmost position among the notch edge portions to be spaced away from the sub-straight edge portions with respect to the second direction.

12. The display device of claim 1, wherein the lower substrate has a thickness smaller than a thickness of the upper substrate.

13. A display device comprising:

a lower substrate divided into an active area in which a pixel comprising a light-emitting element is disposed and a peripheral area adjacent to the active area, and comprising a lower edge, a driving circuit electrically connected to the pixel and disposed in the peripheral area;

an upper substrate overlapping the active area and the peripheral area and provided with a plurality of notches defined therein and recessed in a first direction toward the active area, the upper substrate comprising:

an upper edge comprising:

notch edge portions defining the plurality of notches; and a straight edge portion extending from the notch edge portions, corresponding to the lower edge extending in a second direction crossing the first direction, and comprising a sub-straight edge portion being disposed between the notch edge portions adjacent to each other;

a coupling member coupling the lower substrate with the upper substrate; and a flexible circuit board disposed in the peripheral area and overlapping at least one of the plurality of notches, wherein a portion of the peripheral area which does not overlap the plurality of notches is covered by the upper substrate, the lower edge extends in a second direction crossing the first direction, the driving circuit and the flexible circuit board overlap at least one of the plurality of notches, the driving circuit is disposed between the notch edge portions and the flexible circuit board in a plan view, and a portion of the coupling member, which is adjacent to the notch edge portion, extends in the second direction, wherein the lower edge corresponding to the sub-straight edge portion is aligned with the sub-straight edge portion.

14. The display device of claim 13, wherein the coupling member comprises a first coupling edge adjacent to the active area and a second coupling edge facing the first coupling edge in the first direction and adjacent to the upper edge, and each of the first and second coupling edges extends in a straight line.

15. The display device of claim 13, wherein the notch edge portions comprises a first edge portion, a second edge portion facing the first edge portion in the second direction, and a third edge portion disposed between the first edge portion and the second edge portion and extending in the second direction, each of a first end portion of the first edge portion adjacent to the third edge portion and a first end portion of the second edge portion adjacent to the third edge portion has a predetermined curvature, and each of a second end portion of the first edge portion and a second end portion of the second edge portion has a predetermined curvature.

16. The display device of claim 15, wherein each of a curvature center of the first end portion of the first edge portion and a curvature center of the first end portion of the second edge portion is disposed outside the upper substrate, and each of a curvature center of the second end portion of the first edge portion and a curvature center of the second end portion of the second edge portion is disposed inside the upper substrate.

17. The display device of claim 13, wherein a separation distance in the first direction between a vertex of the flexible circuit board overlapping the lower substrate and each of the notch edge portions is equal to a separation distance in the second direction between the vertex and each of the notch edge portions in a plan view.

18. An electronic device comprising:

a display device comprising:

a lower substrate comprising an active area in which a pixel comprising a light-emitting element is disposed and a peripheral area adjacent to the active area and comprising a lower edge;

a driving circuit electrically connected to the pixel and disposed in the peripheral area;

an upper substrate overlapping the active area and the peripheral area and provided with a plurality of notches defined therein and recessed in a first direction toward the active area, the upper substrate comprising:

an upper edge comprising:

notch edge portions defining the plurality of notches and each of the notch edge portions comprising:

a first edge portion;

a second edge portion facing the first edge portion in a second direction crossing the first direction; and a third edge portion disposed between the first edge portion and the second edge portion and extending in the second direction; and a straight edge portion extending from the notch edge portions, and comprising a sub-straight edge portion being disposed between the notch edge portions adjacent to each other; and a flexible circuit board disposed in the peripheral area, wherein a portion of the peripheral area which does not overlap the plurality of notches is covered by the upper substrate, the driving circuit and the flexible circuit board overlap at least one of the plurality of notches, the driving circuit is disposed between the third edge portion and the flexible circuit board in a plan view, each of a first end portion of the first edge portion adjacent to the third edge portion and a first end portion of the second edge portion adjacent to the third edge portion has a predetermined curvature, and each of a second end portion of the first edge portion and a second end portion of the second edge portion has a predetermined curvature, wherein the lower edge corresponding to the sub-straight edge portion is aligned with the sub-straight edge portion.

* * * * *